United States Patent
Shiraishi et al.

(12)

(10) Patent No.: US 6,919,218 B2
(45) Date of Patent: Jul. 19, 2005

(54) MANUFACTURING METHOD FOR SEALING A SEMICONDUCTOR DEVICE

(75) Inventors: Satoshi Shiraishi, Nagano (JP); Yoichi Kazama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/868,513

(22) Filed: Jun. 15, 2004

(65) Prior Publication Data

US 2005/0014307 A1 Jan. 20, 2005

(30) Foreign Application Priority Data

Jul. 18, 2003 (JP) .................................... 2003-276961

(51) Int. Cl.⁷ .............................................. H01L 21/00
(52) U.S. Cl. ........................ 438/55; 438/26; 438/118; 438/121
(58) Field of Search ................. 174/52.2, 52.4; 257/432, 433; 359/808, 811; 386/118; 438/24–27, 55, 57, 60, 106, 118, 121, 124–127; 439/76.1, 248, 278

(56) References Cited

U.S. PATENT DOCUMENTS

| | | | | |
|---|---|---|---|---|
| 5,059,558 A | * | 10/1991 | Tatsanakit et al. | 438/125 |
| 5,081,327 A | * | 1/1992 | Graham et al. | 174/52.4 |
| 5,302,778 A | * | 4/1994 | Maurinus | 174/52.4 |
| 5,880,403 A | * | 3/1999 | Czajkowski et al. | 174/35 R |

FOREIGN PATENT DOCUMENTS

JP   2002-185827   6/2002

* cited by examiner

*Primary Examiner*—Asok Kumar Sarkar
(74) *Attorney, Agent, or Firm*—Ladas & Parry LLP

(57) ABSTRACT

A manufacturing method of a semiconductor device that is sealed by bonding a sealing member to a substrate mounting a semiconductor element thereon includes the steps of: forming an opening in the sealing member; and closing the opening after the sealing member is bonded to the substrate.

12 Claims, 5 Drawing Sheets

MANUFACTURING METHOD FOR SEALING A SEMICONDUCTOR DEVICE

BACKGROUND OF THE INVENTION

1. Field of the Invention

The present invention generally relates to manufacturing methods of semiconductor devices, and more particularly, to a manufacturing method of a semiconductor device that includes a step of sealing the semiconductor device by providing a sealing member on a substrate mounting a semiconductor element thereon.

2. Description of the Related Art

Recently, with the rapid progress and development in information communication technologies, improvement of data communication speed and increase in data communication amount have been realized, and mobile electronic devices such as mobile phones and notebook computers incorporating therein a semiconductor device (imaging apparatus) such as a CCD (charge coupled device) image sensor and a CMOS image sensor are becoming popular. Such mobile electronic devices can transmit in real time image data obtained by an imaging apparatus in addition to character data (refer to Japanese Laid-Open Patent Application No. 2002-185827, for example).

FIG. 1A shows such a conventional imaging apparatus 100. As shown in FIG. 1A, the imaging apparatus 100 generally includes an optical sensor element 1, a substrate 2, and a holder 5. The optical sensor element 1 is, for example, a CCD image sensor or a CMOS image sensor. The optical sensor element 1 is mounted on the substrate 2.

The holder 5 is provided with a lens 6 for focusing an image on a photo-accepting surface of the optical sensor element 1. The holder 5 is fixed to the substrate 2 by using adhesive 4. Thus, the optical sensor element 1 is sealed in an internal space 7 formed in the holder 5. Accordingly, it is possible to prevent dust from adhering to an imaging surface of the optical sensor element 1.

Referring to FIGS. 1A and 2A through 2C, a description is given below of a manufacturing method of the imaging apparatus 100 having the above-mentioned structure.

In order to manufacture the imaging apparatus 100 shown in FIG. 1A, first, as shown in FIG. 2A, the optical sensor element 1 is mounted on the substrate 2. Although not shown in the drawings, the optical sensor element 1 is electrically connected to the substrate 2 by, for example, gold wire.

Then, as shown in FIG. 2B, the adhesive 4 is deposited on a top surface of the substrate 2 at a predetermined portion by using a dispenser 3. The positions at which the adhesive 4 is deposited are set so as to correspond to the shape of a bottom end of the holder 5. Generally, a thermo-setting resin, which provides a good bonding and achieves reliable bonding, is used as the adhesive 4.

Upon completion of the depositing process of the adhesive 4, as shown in FIG. 2C, the holder 5 is pressed against the substrate 2 at the positions where the adhesive 4 is deposited so as to temporarily fix the holder 5 to the substrate 2. Then, the substrate 2 on which the holder 5 is temporarily fixed is loaded in a curing apparatus and a curing process (heating process) is performed so as to cure the adhesive 4. Consequently, the adhesive 4 is cured and the holder 5 is bonded to the substrate 2.

With the above-mentioned manufacturing steps, the imaging apparatus 100 as shown in FIG. 1A is manufactured. Since the optical sensor element 1 is sealed by the holder 5 as mentioned above, it is possible to prevent dust or the like from adhering to the optical sensor element 1.

In a state where the holder 5 is temporarily fixed to the substrate 4 by using the adhesive 4, the internal space 7 formed between the substrate 2 and the holder 5 is airtight. When the curing process is performed in such a state, the air in the internal space 7 is heated and expanded, which results in an increase in the air pressure in the internal space 7. Thus, a difference (air pressure difference) is generated between the inside and outside of the holder 5.

As mentioned above, in the manufacturing method of the conventional semiconductor device, the curing process is performed in the state where the internal space 7, which is formed by the holder 5 and the substrate 2, is sealed. Hence, as shown in FIG. 1B, there is a problem in that a damaged portion 8 may be generated at a bonding position between the substrate 2 and the holder 5 due to the increase in the air pressure in the holder 5 (internal space 7), and airtightness of the internal space 7 formed by the holder 5 and the substrate 2 may not be maintained even if the adhesive 4 is cured. In such a case, dust may enter the internal space 7 via the damaged portion 8 and adhere to the optical sensor element 1, which causes a reduction in reliability of the imaging apparatus 100.

SUMMARY OF THE INVENTION

A general object of the present invention is to provide an improved and useful manufacturing method of a semiconductor device in which one or more of the above-mentioned problems are eliminated.

Another and more specific object of the present invention is to provide a manufacturing method of a semiconductor device that can suppress generation of a damaged portion even if the pressure in a sealing member is increased due to heating.

In order to achieve the above-mentioned objects, according to one aspect of the present invention, there is provided a manufacturing method of a semiconductor device in which method the semiconductor device is sealed by bonding a sealing member to a substrate mounting a semiconductor element thereon, the manufacturing method including the steps of:

forming an opening in the sealing member; and closing the opening after the sealing member having the opening formed therein is bonded to the substrate so as to seal the semiconductor device.

According to the present invention, the opening formed in the sealing member is closed after the sealing member is bonded to the substrate so as to seal the semiconductor device. Hence, even if a heating process is performed after the sealing member is bonded to the substrate, the air in the sealing member communicates with the air outside the sealing member (more specifically, the air in the space formed by the sealing member and the substrate communicates with the air outside the sealing member and the substrate). Hence, a pressure difference is not generated between the inside and outside the space formed by the sealing member (more specifically, between the pressure in the space formed by the sealing member and the substrate and the pressure of the air outside the space formed by the sealing member and the substrate). Accordingly, it is possible to prevent a bonding portion between the sealing member and the substrate from being damaged and maintain airtightness of the space.

In an embodiment of the present invention, the step of closing the opening may be performed after heating processes of the semiconductor element, the substrate, and the sealing member end.

Accordingly, since the opening is closed after the heating processes of the respective members end, it is possible to positively avoid a pressure difference between the inside and outside of the sealing member.

In an embodiment of the present invention, the step of closing the opening may be performed by using an adhesive. In addition, the adhesive may be an ultraviolet-curing type resin or an instant adhesive.

In a case where the ultraviolet-curing type adhesive is used, the ultraviolet-curing type is cured in a short period of time by irradiation of ultraviolet light. On the other hand, in a case where the instant adhesive is used, the instant adhesive is cured in the air in a short period of time. Hence, it is possible to close the opening in a short period of time. Accordingly, it is possible to avoid faulty bonding that is caused by variation of the pressure in the sealing member during the time period required for the adhesive to be cured.

In an embodiment of the present invention, the semiconductor element may be a photoelectric conversion element.

By using the photoelectric conversion element as the semiconductor element, it is possible to perform a good photoelectric conversion process. That is, though the photoelectric conversion element is vulnerable to adhesion of dust thereto, according to the present invention, since it is possible to maintain an airtight state of the space formed by the sealing member and the substrate, dust does not enter the space formed by the sealing member and the substrate. Thus, dust does not adhere to the photoelectric conversion element and it is possible to perform good photoelectric conversion by using the photoelectric conversion element.

According to the present invention, even if the heating process is performed after the sealing member is bonded to the substrate, the air in the space formed between the sealing member and the substrate communicates with the air outside the space formed by the sealing member and the substrate. Hence, a pressure difference is not generated between inside and outside the space. Accordingly, it is possible to prevent the bonding portion between the sealing member and the substrate from being damaged and maintain airtightness of the space. Thus, it is possible to improve reliability of a semiconductor device.

Other objects, features and advantages of the present invention will become more apparent from the following detailed description when read in conjunction with the following drawings.

DETAILED DESCRIPTION OF THE PREFERRED EMBODIMENTS

Figure 1A:
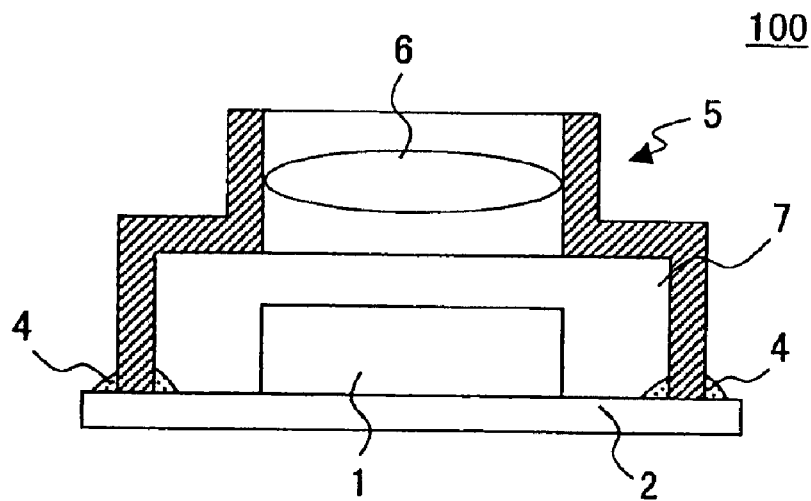
FIG. 1A is a schematic diagram for explaining a manufacturing method of a conventional semiconductor device.
Figure 1B:
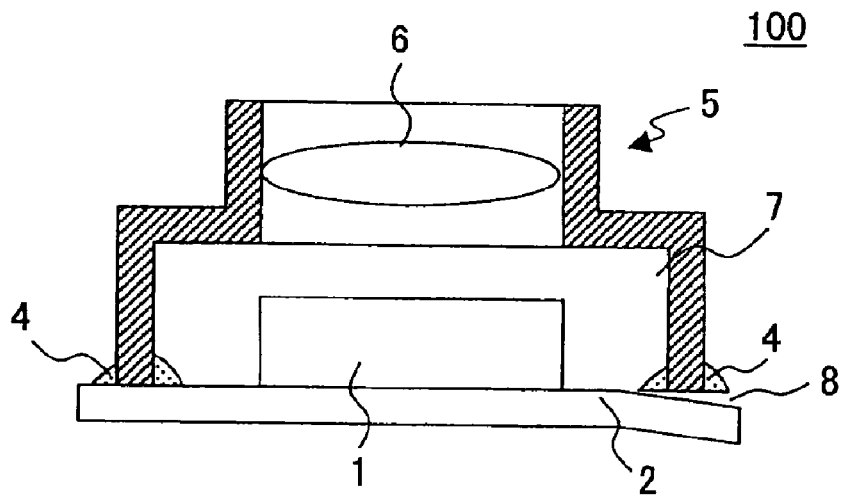
FIG. 1B is a schematic diagram showing a state where a damaged portion is generated in the semiconductor device shown in FIG. 1A.
Figure 2A:
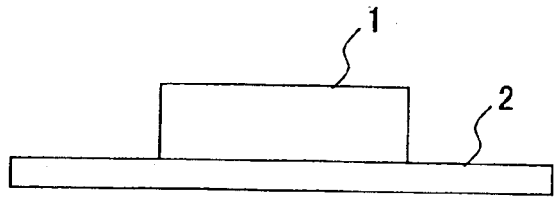
FIGS. 2A, 2B and 2C are schematic diagrams for explaining the manufacturing method of the conventional semiconductor device shown in FIG. 1A.
Figure 2B:
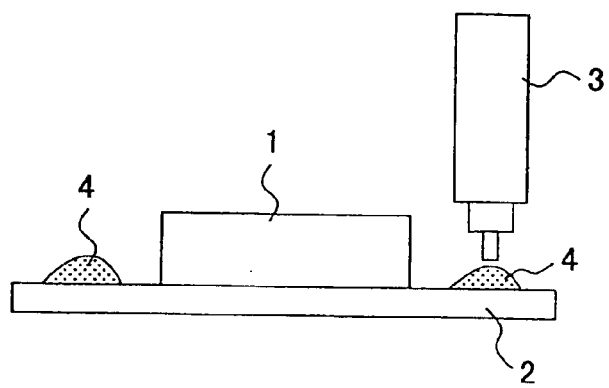
Figure 2C:
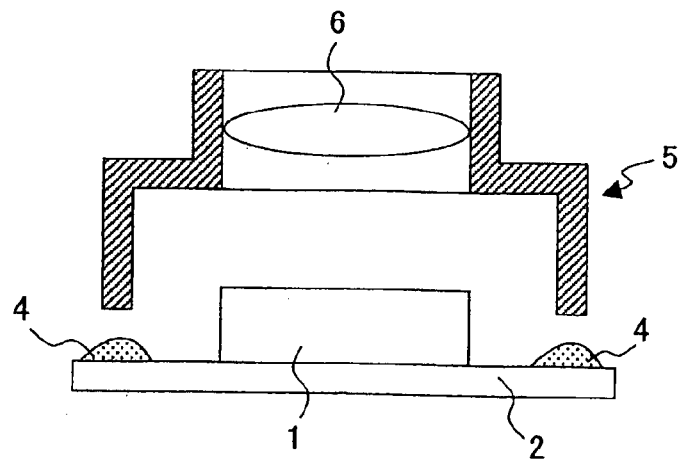

A description is given below of a preferred embodiment of the present invention, with reference to the drawings.

FIGS. 3A through 3C, 4A and 4B are diagrams for explaining a manufacturing method of a semiconductor device according to one embodiment of the present invention. FIG. 5 shows a semiconductor device (imaging apparatus) 10 manufactured by the manufacturing method according to the embodiment of the present invention.

It should be noted that, in this embodiment, the description is given by taking the imaging apparatus 10 incorporating therein a semiconductor element (hereinafter referred to as "the optical sensor element 11") such as a CCD (charge coupled device) sensor or a CMOS sensor as a semiconductor device.

First, for convenience of explanation, the structure of the imaging apparatus 10 is explained, and then, the manufacturing method of the imaging apparatus 10 is explained.

As shown in FIG. 5, the imaging apparatus 10 generally includes the optical sensor element 11, a substrate 12, and a holder 13, which serves as a sealing member.

The optical sensor element 11 is, as mentioned above, a semiconductor element such as a CCD image sensor or a CMOS image sensor. The optical sensor element 11 is mounted on the substrate 12. More specifically, a control element 14 is mounted on the substrate 12, and the optical sensor element 11 is mounted on the control element 14.

The control element 14 performs drive control of the optical sensor element 11. Hence, the optical sensor element 11 is connected to the control element 14 by means of wires 15. In addition, the control element 14 is electrically connected to the substrate 12 by means of wires 17. Further, a passive element 16 such as a condenser is also mounted on the substrate 12.

The holder 13 includes a lens holder 20, a housing 21, and a condenser lens 22, for example. The holder 13 is formed into a cylindrical shape and is provided with the condenser lens 22 therein. The condenser lens 22 serves to focus an image with respect to a photo-accepting surface of the optical sensor element 11 in a state where the holder 13 is mounted on the substrate 12. An aperture 23 for cutting unwanted light is provided on a top surface of the condenser lens 22.

A cover glass 24 is provided at a top portion of the holder 13 that faces the condenser lens 22. The cover glass 24 is a cover for dust control and prevents dust from adhering to the condenser lens 22.

The housing 21 includes a small diameter portion 21a and a large diameter portion 21b. A shoulder portion 21c is formed between the small diameter portion 21a and the large diameter portion 21b. A protruding screw portion is formed on the outer periphery of the small diameter portion 21a, and a receiving screw portion is formed on the inner periphery of the lens holder 20.

That is, the lens holder 20 is configured to be screwed to the small diameter portion 21a of the housing 21. In a state where the lens holder 20 is screwed to the housing 21, the lens holder 20 and the housing 21 form an airtight boundary.

The bottom portion of the large diameter portion 21b is fixed to the substrate 12 by means of adhesive 28. Thus, an internal space 27 formed between the substrate 12 and the holder 13 is airtight. Accordingly, it is possible to prevent dust from adhering to the optical sensor element 11, which is located in the internal space 27.

Referring to the shoulder portion 21c formed between the small diameter portion 21a and the large diameter portion 21b, in this embodiment, an air hole (opening) 25 is formed in the shoulder portion 21c, and the air hole 25 is closed with the adhesive 28.

Next, referring to FIGS. 3A through 3C, 4A and 4B, a description is given below of the manufacturing method of the imaging apparatus 10 having the above-mentioned structure. It should be noted that, in FIGS. 3A through 3C, 4A and 4B, only a part of the structure shown in FIG. 5 is illustrated so that the manufacturing method is easily understood.

Figure 3A:
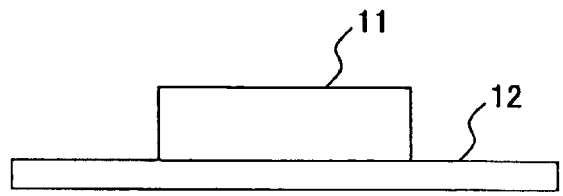
FIGS. 3A, 3B and 3C are schematic diagrams for explaining a manufacturing method of a semiconductor device according to one embodiment of the present invention.

In order to manufacture the imaging apparatus 10 shown in FIG. 5, first, as shown in FIG. 3A, the optical sensor element 11 is mounted on the substrate 12. Although not shown in the drawings, in this step, the passive element 16 is mounted, and bonding processes of the wires 15 and 17 are also performed.

Figure 3B:
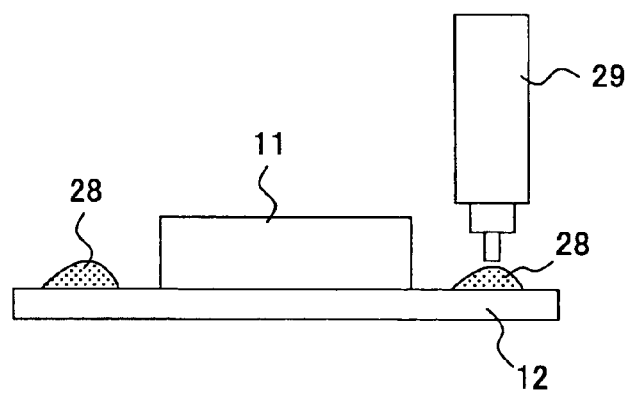

Then, as shown in FIG. 3B, the adhesive 28 is deposited on the top surface of the substrate 12 at predetermined positions by using a dispenser 29. The positions at which the adhesive 29 is deposited are set so as to correspond to the shape of the bottom portion of the holder 13 (more specifically, the shape of the bottom portion of the large diameter portion 21b). Generally, a thermo-setting resin, which provides a good bonding and achieves reliable bonding, is used as the adhesive 28.

Figure 3C:
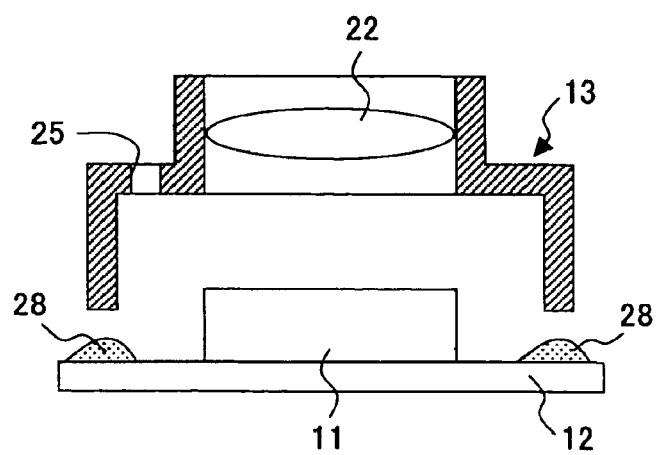

Upon completion of the depositing process of the adhesive 28, as shown in FIG. 3C, the bottom portion of the holder 13 is pressed against the substrate 12 at the positions where adhesive 28 is deposited. In the aforementioned manner, the holder 13 is temporarily fixed to the substrate 12. Then, the substrate 12 on which the holder 13 is temporarily fixed is loaded in a curing apparatus and a curing process (heating process) is performed so as to cure the adhesive 28.

Consequently, the adhesive 28 is cured and the holder 13 is bonded to the substrate 12. In such a state, the internal space 27 formed between the substrate 12 and the holder 13 is sealed with the optical sensor element 11 located therein.

Figure 4A:
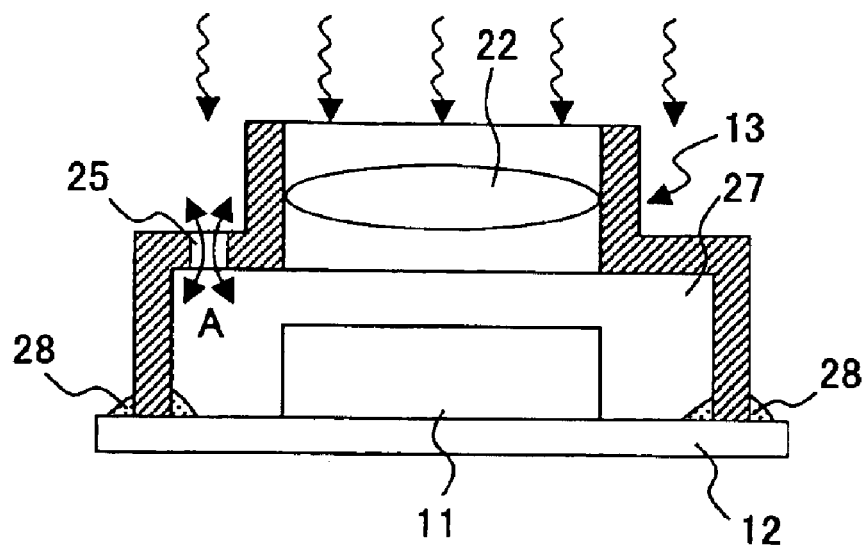
FIGS. 4A and 4B are additional schematic diagrams for explaining the manufacturing method of the semiconductor device according to the embodiment of the present invention.
Figure 4B:
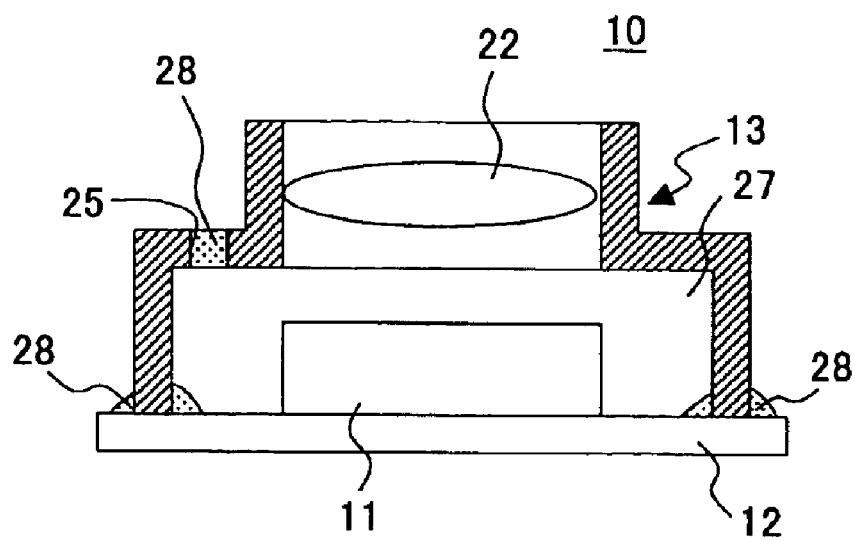
Figure 5:
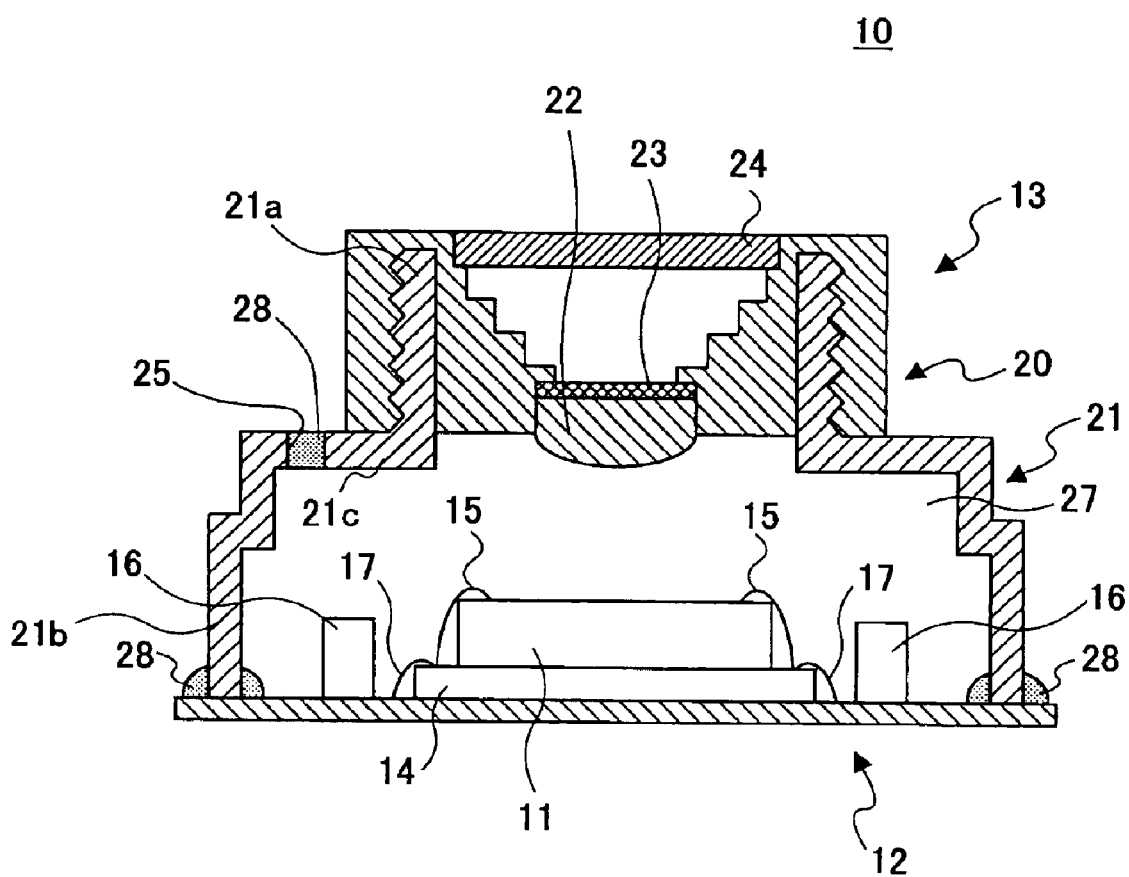
FIG. 5 is a schematic diagram showing a semiconductor device (imaging apparatus) manufactured by the manufacturing method according to the embodiment of the present invention.

FIG. 4A shows the substrate 12 and the holder 13 during the curing process. By performing the curing process, the air inside the internal space 27 is heated and expanded. However, the air hole (opening) 25 is formed in the holder 13 in this embodiment. Thus, the internal space 25 communicates with the outside of the holder 13 via the air hole 25.

Hence, even if the air in the internal space 27 formed between the substrate 12 and the holder 13 is heated and expanded, the air is discharged to the outside of the holder 13 via the air hole 25 (such air flows are indicated by arrows A in FIG. 4A). That is, the pressure in the internal space 27 becomes the same as the pressure outside the holder 13, and a pressure difference (air pressure difference) is not generated between the inside and outside of the holder 13 during the curing process. Accordingly, it is possible to prevent the bonding portion between the substrate 12 and the holder 13, more specifically, the portion bonded by means of the adhesive 28, from being damaged during the curing process.

Upon completion of the curing process (heating process) for bonding the holder 13 to the substrate 12, a process for closing the air hole 25 is subsequently performed. The process for closing the air hole 25 is performed after the temperatures of the substrate 12 and the holder 13 return to normal temperatures.

When there are other heating processes for heating the optical sensor element 11, the substrate 12, and the holder 13 in addition to the curing process for bonding the holder 13 to the substrate 12, the process for closing the air hole 25 is performed after such other heating processes are completed.

In this embodiment, the adhesive 28 is used in the process for closing the air hole 25. The adhesive 28 is an ultraviolet-curing type adhesive. By irradiating ultraviolet light to the air hole 25 after filling the air hole 25 with the adhesive 28 in a softened state, the adhesive 28 is cured in a short period of time.

By using the ultraviolet-curing type adhesive 28 as in this embodiment, it is possible to cure the adhesive 28 in a short period of time by irradiation of ultraviolet light. It is conceivable that the pressure in the holder 13 (internal space 27) may vary since the temperature of the internal space 27 is increased by irradiation of ultraviolet light during the time period required for the adhesive 28 to be cured. However, since the air hole 25 is provided in this embodiment, the pressure in the holder 13 does not vary during the time period required for the adhesive 28 to be cured. Thus, it is possible to avoid faulty bonding.

The adhesive 28 is not limited to the ultraviolet-curing type, and an instant adhesive that is cured in the air in a short period of time may be used instead.

By closing the air hole 25 in the aforementioned manner, the internal space 27 is separated from the outside of the holder 13, and the optical sensor element 11 is located in the sealed internal space 27. Since the air hole 25 is closed after completion of the heating process performed in the manufacturing process of the imaging apparatus 10, a pressure difference between the inside and outside of the holder 13 is not generated after the internal space 27 having therein the optical sensor element 11 is sealed.

Hence, it is possible to prevent the bonding portion between the substrate 12 and the holder 13 from being damaged and maintain the airtight state of the internal space 27. Thus, it is possible to positively avoid adhesion of dust to the optical sensor element 11.

The optical sensor element 11 (a CCD sensor or a CMOS sensor, for example) used in this embodiment is vulnerable to adhesion of dust. According to this embodiment, since it is possible to positively avoid entering of dust from the outside, it is possible to perform a good photoelectric conversion process by the optical sensor element 11 and improve reliability of the imaging apparatus 10.

Further, in the above-mentioned embodiment, only the single air hole (opening) 25 is formed. However, the number of the air holes 25 is not limited to one. Additionally, in the above-mentioned embodiment, the air hole 25 is provided in the shoulder portion 21c of the holder 13 (housing 21). However, this is not a limitation of the position of the air hole 25. The air hole 25 may be formed in the large diameter portion 21b or the substrate 12.

According to the present invention, even if the curing process (heating process) is performed after the holder 13 (sealing member) is bonded to the substrate 12, the air in the internal space 27 formed between the holder 13 and the substrate 12 communicates with the air outside the holder 13 (internal space 27). Hence, a pressure difference is not generated between the inside and outside the holder 13 (internal space 27). Accordingly, it is possible to prevent the bonding portion between the holder 13 and the substrate 12 from being damaged and maintain airtightness of the internal space 27. Thus, it is possible to improve reliability of the semiconductor device (imaging apparatus) 10.

The present invention is not limited to the specifically disclosed embodiments, and variations and modifications may be made without departing from the scope of the present invention.

The present application is based on Japanese priority application No. 2003-276961 filed on Jul. 18, 2003, the entire contents of which are hereby incorporated by reference.

What is claimed is:

1. A manufacturing method of a semiconductor device in which method said semiconductor device is sealed by bonding a sealing member to a substrate mounting a semiconductor element thereon, said manufacturing method comprising the steps of:

forming an opening in the sealing member; and closing the opening after the sealing member having the opening formed therein is bonded to the substrate so as to seal the semiconductor device, wherein the closing step is performed after temperatures of the sealing member and the substrate return to normal temperature.

2. The manufacturing method as claimed in claim 1, wherein the step of closing the opening is performed after heating processes of the semiconductor element, the substrate, and the sealing member end.

3. The manufacturing method as claimed in claim 2, wherein the step of closing the opening is performed by using an adhesive.

4. The manufacturing method as claimed in claim 3, wherein the semiconductor element is a photoelectric conversion element.

5. The manufacturing method as claimed in claim 3, wherein the adhesive is an ultraviolet-curing type adhesive.

6. The manufacturing method as claimed in claim 3, wherein the adhesive is an instant adhesive.

7. The manufacturing method as claimed in claim 2, wherein the semiconductor element is a photoelectric conversion element.

8. The manufacturing method as claimed in claim 1, wherein the step of closing the opening is performed by using an adhesive.

9. The manufacturing method as claimed in claim 8, wherein the semiconductor element is a photoelectric conversion element.

10. The manufacturing method as claimed in claim 8, wherein the adhesive is an ultraviolet-curing type adhesive.

11. The manufacturing method as claimed in claim 8, wherein the adhesive is an instant adhesive.

12. The manufacturing method as claimed in claim 1, wherein the semiconductor element is a photoelectric conversion element.

* * * * *